United States Patent [19]

Andrade

[11] 4,404,732
[45] Sep. 20, 1983

[54] SELF-ALIGNED EXTENDED EPITAXY MESFET FABRICATION PROCESS

[75] Inventor: Thomas L. Andrade, Oakton, Va.

[73] Assignee: IBM Corporation, Armonk, N.Y.

[21] Appl. No.: 327,832

[22] Filed: Dec. 7, 1981

[51] Int. Cl.³ .................. H01L 21/203; H01L 21/306
[52] U.S. Cl. .................................. 29/571; 29/576 E;
29/578; 29/580; 29/591; 148/174; 148/175;
156/649; 357/15; 357/22; 427/84; 427/88
[58] Field of Search .................. 29/571, 576 E, 578,
29/580, 591; 148/175, 174; 427/84, 88;
156/649; 357/15 P, 15 PGA, 22

[56] References Cited

U.S. PATENT DOCUMENTS

| | | | |
|---|---|---|---|
| 3,609,477 | 9/1971 | Drangeid et al. | 357/15 |
| 3,943,622 | 3/1976 | Kim et al. | 29/571 X |
| 4,077,111 | 3/1978 | Driver et al. | 29/580 X |
| 4,111,725 | 9/1978 | Cho et al. | 148/175 |
| 4,236,166 | 11/1980 | Cho et al. | 357/22 |
| 4,336,549 | 6/1982 | Ladd | 357/15 |

FOREIGN PATENT DOCUMENTS 53-38272  4/1978  Japan ........................... 357/22 S

OTHER PUBLICATIONS

Suzuki et al., "GaAs Power FET" Fujitsu Sci. & Tech. J. (Japan) vol. 12, No. 2, (Jun. 1976), pp. 163–177.
Metze et al., "GaAs Integrated Circuits—Molecular Beam Epitaxy" Appl. Phys. Lett., vol. 37 (7) Oct. 1, 1980, pp. 628–630.
Bozler et al., "Fabrication—of the Permeable Base Transistor" IEEE Trans. on Electron Dev., vol. ED-27, No. 6, Jun. 1980, pp. 1128–1141.

Primary Examiner—W. G. Saba
Attorney, Agent, or Firm—Maurice H. Klitzman

[57] ABSTRACT

A fabrication process for a gallium arsenide MESFET device is disclosed. A feature of the invention is placing a gate structure on the gallium arsenide substrate. Then a process including molecular beam epitaxy, grows epitaxial gallium arsenide on each respective side of the gate, forming a raised source region and a raised drain region. Gallium arsenide will not grow in a conductive state on top of a tungsten gate metal. The resulting MESFET device has a raised source and drain which significantly reduces the high resistance depleted surface adjacent to the gate which generally occurs in planer gallium arsenide MESFET devices. Furthermore, the MESFET channel region which is defined by the proximate edges of the source and the drain, is self-aligned with the edges of the gate by virtue of the insitu process for the formation of the source and drain, as described above.

12 Claims, 6 Drawing Figures

SELF-ALIGNED EXTENDED EPITAXY MESFET FABRICATION PROCESS

FIELD OF THE INVENTION

The invention disclosed broadly relates to semiconductor processing and more particularly relates to a method for fabricating gallium arsenide MESFET devices.

BACKGROUND OF THE INVENTION

In prior art gallium arsenide MESFET devices, a critical parameter for the device structure is the product of the dopant concentration N times the square of the thickness of the active layer beneath the gate electrode ($a^2$). Since the threshold voltage $V_T$ is proportional to $Na^2$, prior workers have attempted to maintain good control over $Na^2$ by etching the active layer to the desired thickness, such as is disclosed by Metze, et al. in "Gallium Arsenide Integrated Circuits by Selected Area Molecular Beam Epitaxy," *Applied Physics Letters,* Volume 37, No. 7, October 1980, pages 628–630. However, the tolerance on the resultant value of a is poor since this tolerance is both a function of the tolerance of the thickness of the deposited epitaxial layer and the depth of penetration of the etched region.

Another problem which arises in other prior art MESFET gallium arsenide structures is that the relative volatility of the arsenic component in the gallium arsenide semiconducting material alters the composition of that material at its external surfaces. For example, prior art MESFET structures wherein the region on each respective side of the gate is an exposed surface, the gallium arsenide surface possesses a high density of surface states near the mid band gap region. This phenomenon causes a surface state band bending condition to result so that the resultant gallium arsenide regions on opposite sides of the gate are in a partly depleted condition. This depleted condition causes a much higher resistivity to the regions surrounding the gate region than can be tolerated for good device characteristics. Attempts have been made to overcome this problem by ion implanting N+ highly conductive regions in the semi-insulating bulk surrounding the gate of the MESFET device. This approach to solving the problem, however, introduces processing difficulties inasmuch as a relatively high temperature of 800° C. is required to activate the N+ dopant in the semi-insulating bulk.

OBJECTS OF THE INVENTION

It is therefore an object of the invention to fabricate an improved gallium arsenide self-aligned MESFET device.

It is still a further object of the invention to provide a gallium arsenide improved MESFET device which avoids high resistance depleted surfaces adjacent to the gate.

SUMMARY OF THE INVENTION

These and other objects, features and advantages of the invention are accomplished by the self-aligned extended epitaxy MESFET fabrication method disclosed herein. A fabrication process for a gallium arsenide MESFET device is disclosed which provides for the insitu growth of self-aligned, raised source and drain regions. One feature of the invention is placing a high temperature resistant gate structure, such as tungsten, on the gallium arsenide substrate 2. Then by a process, including molecular beam epitaxy, growing epitaxial gallium arsenide on each respective side of the gate so as to form a raised source region and a raised drain region. Depending on the expitaxy method, gallium arsenide will not grow to the top of the tungsten gate metal or grow in a nonconductive state (polycrystalline). The resulting MESFET device has a raised source and drain which significantly reduces the high resistance depleted surface adjacent to the gate which generally occurs in planer gallium arsenide MESFET devices. Furthermore, the MESFET channel region which is defined by the proximate edges of the source and the drain, is self-aligned with the edges of the gate by virtue of the insitu process for the formation of the source and drain, as described above. This improves the tolerance in the alignment of the gate with the source and drain. Also, the placement of the gate structure on the substrate at an early phase of the process also reduces the amount of residual contamination in the channel region of the resultant device.

DESCRIPTION OF THE FIGURES

These and other objects, features and advantages of the invention will be more fully appreciated with reference to the accompanying figures.

DISCUSSION OF THE PREFERRED EMBODIMENT

Figure 1:
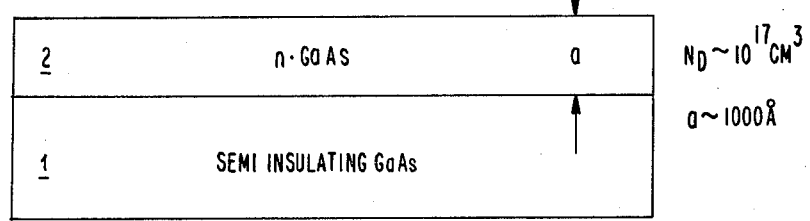
FIG. 1 illustrates a beginning step in the process where an N-type gallium layer exists over semi-insulating gallium arsenide.

A fabrication process for a gallium arsenide MESFET device is disclosed which provides for the insitu growth of self-aligned, raised source and drain regions. A feature of the invention is placing a high temperature resistant gate structure 5 on the gallium arsenide substrate 2. The placement of the gate structure 5 on the substrate 2 at an early phase of the process reduces the amount of residual contamination in the channel region of the resultant device. Then with a process, including molecular beam epitaxy, growing epitaxial gallium arsenide on each respective side of the gate 5, forming a raised source region 8 and a raised drain region 9. Gallium arsenide will either grow polycrystalline on the gate structure (tungsten) or will not grow at all. The resulting MESFET device has a raised source and drain which significantly reduces the high resistance depleted surface adjacent to the gate which generally occurs in planer gallium arsenide MESFET devices. Furthermore, the MESFET channel region which is defined by the proximate edges of the source 8 and the drain 9, is self-aligned with the edges of the gate 5 by virtue of the insitu process for the formation of the source and drain, as described above.

The above prior art problems are solved by the self-aligned extended epitaxy MESFET structure and fabrication method disclosed as follows. FIGS. 1 through 5 illustrate the sequence of processing steps which result in the extended epitaxy device. FIG. 1 illustrates the beginning step where a semi-insulating gallium arsenide substrate 1 (or P-type GaAs), has deposited on the surface thereof a layer 2 of N-type gallium arsenide doped, for example, with an N-type dopant donor such as silicon with a concentration $N_D$ of approximately $10^{17}$ atoms per cubic centimeter. The thickness a of the layer 2 is approximately 1000 Å. This layer 2 and thickness can be characterized by a threshold voltage of approximately 0 volts if a metal gate were deposited on the upper surface of the layer 2. That is, 0 volts would be required to form a depletion region beneath a metal gate which would just intersect the interface between the layer and the semi-insulating bulk.

Figure 2:
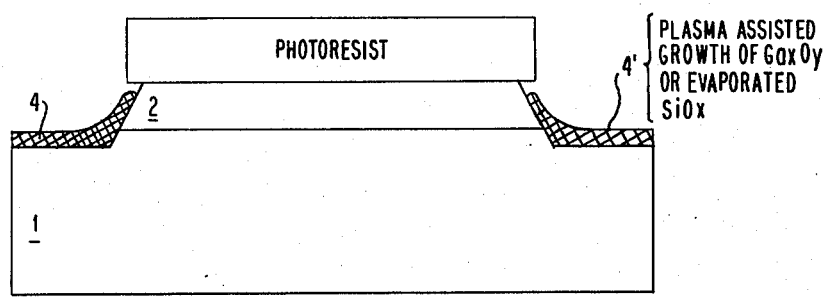
FIG. 2 illustrates the next step in the fabrication process wherein a mesa etch has been carried out to define the active region.

FIG. 2 illustrates the next step in the operation wherein a mesa etch has been carried out to define the active region by removing adjacent portions of the N layer 2. This is done by depositing a photoresist layer 3 on top of the N layer, patterning the photoresist, and then wet chemical or dry chemical etching the layer 2. The wet etching is best accomplished in approximately a 50° C. solution of $H_2SO_4$ and $H_2O_2$ and $H_2O$ at a 3:1:50 ratio because the etching can be easily controlled. Dry etching can be accomplished by plasma etching in $CCl_2F_2$. This is followed by exposing the etched surface to an oxygen plasma to form the gallium oxide layers 4 and 4' on opposite sides and adjacent to the N layer 2 on the surface of the semi-insulating bulk 1. Alternately, $SiO_x$ may be evaporated using the undercut photoresist.

Figure 3:
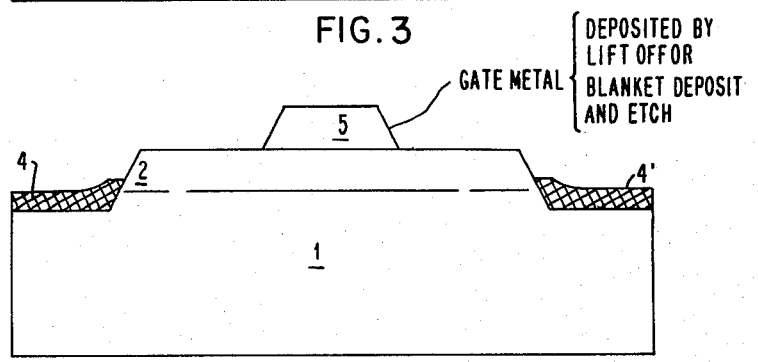
FIG. 3 illustrates the next step in the fabrication process wherein the gate metal is deposited on the surface of the etched layer.

The next step is illustrated in FIG. 3 wherein the gate structure 5 of a metal such as tungsten, or a conductive refractory compound such as tungsten carbide, titanium carbide, tantalum carbide or titanium nitride, is deposited on the surface of the etched N layer 2. All deposited films are either deposited everywhere and etched away or alternately selectively deposited by a lift-off method, for example. Selective deposition is usually done by evaporation for tantalum, hafnium or tungsten or alternately by reactive evaporation for tantalum carbide, hafnium carbide, or tungsten carbide.

Figure 4A:
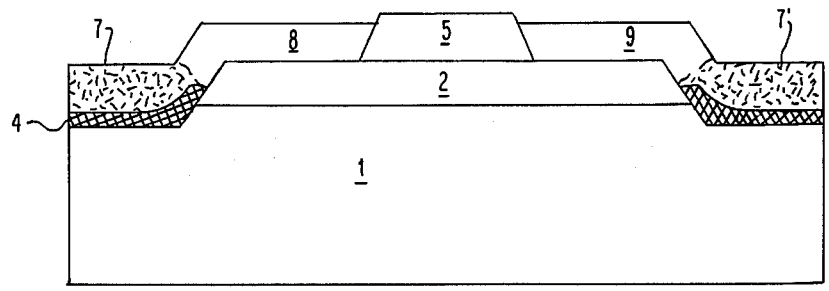
FIG. 4a illustrates the key step in the fabrication process wherein the extended epitaxial gallium arsenide structure is grown. Here no deposition occurs on the gate metal.

FIG. 4a illustrates the next processing step wherein the extended epitaxial gallium arsenide structure is grown. The assembly of FIG. 3 is introduced into an epitaxial reactor, for example, wherein a layer of gallium arsenide as is shown in FIG. 4a, will be epitaxially grown on the gallium oxide layers 4 and 4' on opposite sides and adjacent to the N layer 2 and on the exposed portions of the N layer 2 surrounding the gate metal structure 5. No gallium arsenide will grow on top of the gate metal structure 5 when the gallium arsenide layer is deposited by an equilibrium process such as the halide process vapor phase epitaxy of Bozler, et al., "Fabrication and Numerical Simulations of the Permeable Base Transistor," *IEEE Transactions on Electron Devices*, ED-27, page 1128, June 1980. As a result of the epitaxial deposition, the gallium arsenide layer at 7 and 7' on top of the gallium oxide layers 4 and 4', respectively, which are adjacent to the N layer 2, will be non-conductive polycrystalline and the gallium arsenide layers 8 and 9 on top of the layer 2 will be semiconductive monocrystalline and will be oriented in the same crystal direction as is the orientation of the N layer 2. The monocrystalline layers 8 and 9 will have grown on opposite sides of the gate metal 5 itself, forming the source 8 and drain 9. This is a high temperature step conducted typically at above 600° C. Only a refractory metal or a conductive refractory compound gate material 5 in FIG. 3, can be used here.

The structure now shown in FIG. 4a has the portions of the N layer 2 on opposite sides of the gate metal 5, completely covered by the single crystalline gallium arsenide extended epitaxial layers 8 and 9, forming the source and the drain. This removes the depletion region above the N layer 2. Thus, the regions of the N layer 2 immediately adjacent to the gate metal 5 are no longer depleted and no longer have the intolerably high resistivity of the prior art structures, as described above.

Figure 4B:
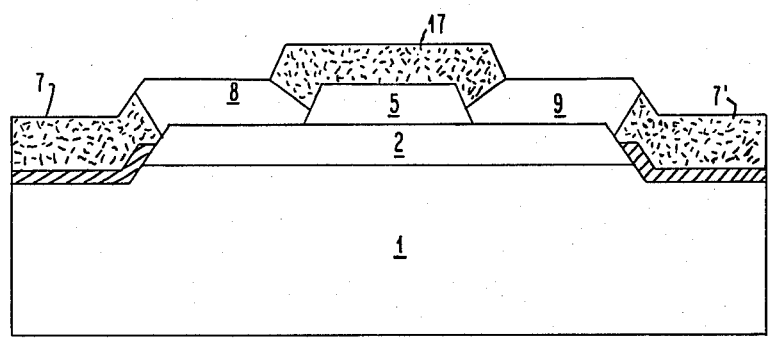
FIG. 4b illustrates an alternate step to that in FIG. 4a, wherein the gallium arsenide deposition results in a deposit also on the gate metal. This deposit may be subsequently etched off the gate metal.

FIG. 4b illustrates an alternative step to that shown in FIG. 4a, where the extended epitaxial layer is deposited by another high temperature process such as molecular beam epitaxy or metal organic chemical vapor deposition which are non-equilibrium. Non-equilibrium growth conditions such as are reported by Metze, et al. cited above, and as exemplified by the molecular beam epitaxy process, is somewhat similar to an evaporation process. The monocrystalline layer 2 provides an ordered surface which nucleates crystalline growth for the epitaxial layers 8 and 9 deposited thereon, whereas the gallium oxide layers 4 and 4' and the tungsten gate metal layer 5 have a disordered surface which nucleates polycrystalline or disordered growth in the deposited gallium arsenide. As a result, the layers 7 and 7' formed on top of the gallium oxide layers 4 and 4', respectively, are polycrystalline, the layers 8 and 9 formed on the monocrystalline layer 2 are monocrystalline, and the layer 17 of gallium arsenide deposited on the tungsten layer 5 is polycrystalline, as is shown in FIG. 4b. After the off-equilibrium process for depositing the gallium arsenide layer shown in FIG. 4b, a suitable etching step is applied to remove the non-conductive polycrystalline gallium arsenide layer 17 from the surface of the gate metal 5 so as to enable contacting the gate 5.

Figure 5:
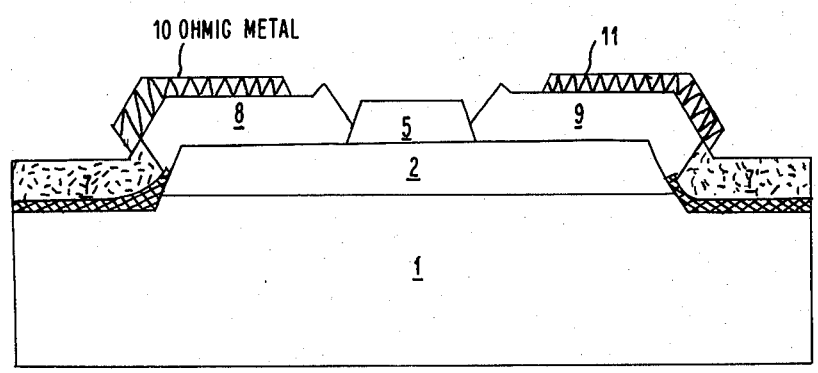
FIG. 5 illustrates a final step in the fabrication process wherein ohmic contacts are formed.

FIG. 5 illustrates the device after the process step shown in FIG. 4a or after the alternate process step shown in FIG. 4b. FIG. 5 illustrates a final step in the sequence of processing steps for the formation of the self-aligned extended epitaxial MESFET structure, wherein ohmic contacts 10 and 11 are formed on the upper surfaces as source and drain contact, respectively, on the upper surfaces of the monocrystalline gallium arsenide extended epitaxial layers 8 and 9, respectively.

Other III-V semiconductor materials can be substituted for the gallium arsenide above, for example indium phosphide.

The resultant self-aligned extended epitaxy MESFET device avoids the high resistance depleted surfaces adjacent to the gate region, thereby improving the operating characteristics of the resultant device. The resultant MESFET device has a gate which is self-aligned with respect to the channel region of the device. The process disclosed does not employ an ion implantation step and therefore tooling costs are reduced and the process is simplified.

Although a specific embodiment of the invention has been disclosed, it will be understood by those of skill in the art that the foregoing and other changes in form and details may be made therein without departing from the spirit and the scope of the invention.

Having thus described our invention, what we claim as new, and desire to secure by Letters Patent is:

1. An improved fabrication process for forming a gallium arsenide MESFET device, comprising the steps of:
    forming an N-type gallium arsenide layer on a low conductivity substrate;
    forming a refractory gate electrode on a selected portion of the surface of said gallium arsenide layer;
    growing an epitaxial gallium arsenide raised source region on said gallium arsenide layer on a first side of said gate and simultaneously therewith growing a gallium arsenide raised drain region on said gallium arsenide layer on a second side of said gate opposite from said first side thereof, said source and drain regions being of N-type conductivity;
    whereby a self-aligned refractory gate MESFET device having a raised source and drain, is formed.

2. An improved fabrication process for forming a gallium arsenide MESFET device, comprising the steps of:
    forming a first N-type gallium arsenide layer on a low conductivity substrate;
    mesa etching said gallium arsenide layer for electrical isolation, defining a first side and an opposed second side thereof;
    depositing an oxide layer on said low conductivity substrate and adjacent to said first and second sides of said gallium arsenide layer;
    forming a high temperature resistant gate electrode on a selected portion of the surface of said gallium arsenide layer;
    depositing a second layer of gallium arsenide on the exposed surfaces of said oxide layer and said first gallium arsenide layer, forming polycrystalline gallium arsenide over said oxide layer and forming epitaxial gallium arsenide over said first gallium arsenide layer, said epitaxial portion of said second gallium arsenide layer forming a raised source region on said first gallium arsenide layer on a first side of said gate and simultaneously forming a raised drain region on said first gallium arsenide layer on a second side of said gate opposite from said first side thereof, said source and drain regions being of N-type conductivity;
    depositing ohmic contacts to said raised source and raised drain regions;
    whereby a self-aligned gate MESFET device having a raised source and drain, is formed.

3. The process of claim 2, wherein said oxide layer is gallium oxide.

4. The process of claim 2, wherein said oxide layer is silicon oxide.

5. The process of claim 2, wherein said gate electrode is a refractory metal.

6. An improved fabrication process for forming a gallium arsenide MESFET device, comprising the steps of:
    forming a refractory gate electrode on a selected portion of the surface of a thin layer of gallium arsenide on a low conductivity substrate;
    epitaxially growing a gallium arsenide raised source region on said gallium arsenide substrate on a first side of said gate and simultaneously growing a gallium arsenide raised drain region on said gallium arsenide substrate on a second side of said gate opposite from said first side thereof, said thin layer of gallium arsenide therebetween forming a channel region;
    whereby a self-aligned refractory gate MESFET device having a raised source and drain, is formed.

7. The process of claim 6 wherein said refractory gate electrode is composed of a material which is a member of the group consisting of tungsten, tungsten carbide, titanium carbide, tantalum carbide, and titanium nitride.

8. An improved fabrication process for forming a III-V semiconductor MESFET device, comprising the steps of:
    forming a high temperature resistant gate electrode on a selected portion of the surface of a thin layer of a III-V semiconductor on a low conductivity substrate;
    epitaxially growing a III-V semiconductor raised source region on said III-V semiconductor substrate on a first side of said gate and simultaneously growing a III-V semiconductor raised drain region on said III-V semiconductor substrate on a second side of said gate opposite from said first side thereof, said thin layer of III-V semiconductor therebetween forming a channel region;
    whereby a self-aligned gate MESFET device having a raised source and drain and a low contamination channel region, is formed.

9. The process of claim 8, wherein said high temperature resistant gate electrode is composed of a material which is a member of the group consisting of tungsten, tungsten carbide, titanium carbide, tantalum carbide, and titanium nitride.

10. The process of claim 8, wherein said III-V semiconductor substrate is gallium arsenide.

11. The process of claim 10, wherein said III-V semiconductor source and drain are gallium arsenide.

12. The process of claim 11, wherein said high temperature resistant gate electrode is composed of a material which is a member of the group consisting of tungsten, tungsten carbide, titanium carbide, tantalum carbide, and titanium nitride.

* * * * *